(12) United States Patent
Tamaki

(10) Patent No.: US 7,560,200 B2
(45) Date of Patent: Jul. 14, 2009

(54) MASK DATA GENERATION METHOD

(75) Inventor: Tokuhiko Tamaki, Osaka (JP)

(73) Assignee: Panasonic Corporation, Osaka (JP)

( * ) Notice: Subject to any disclaimer, the term of this patent is extended or adjusted under 35 U.S.C. 154(b) by 719 days.

(21) Appl. No.: 11/376,191

(22) Filed: Mar. 16, 2006

(65) Prior Publication Data

US 2006/0210890 A1 Sep. 21, 2006

(30) Foreign Application Priority Data

Mar. 16, 2005 (JP) ............................. 2005-075776

(51) Int. Cl.
*G03F 1/00* (2006.01)
*G06F 17/50* (2006.01)
(52) U.S. Cl. ........................................... 430/5; 716/19
(58) Field of Classification Search .................. 430/5; 716/19
See application file for complete search history.

(56) References Cited

U.S. PATENT DOCUMENTS 6,060,368 A * 5/2000 Hashimoto et al. .............. 430/5

FOREIGN PATENT DOCUMENTS

| JP | 64-19470 A | 1/1989 |
| JP | 11-174658 A | 7/1999 |

* cited by examiner

*Primary Examiner*—Mark F Huff
*Assistant Examiner*—John Ruggles
(74) *Attorney, Agent, or Firm*—McDermott Will & Emery LLP

(57) ABSTRACT

In the mask data generation method, optical simulation is performed on a dual gate including a first gate portion doped with an impurity of a first conductivity type and a second gate portion doped with an impurity of a second conductivity type for correcting design data including the dual gate. Specifically, a first dimesion difference of the first gate portion between a resist dimension obtained in lithography and a dimension obtained after dryetch following the lithography is calculated. Next, a second dimension difference of the second gate portion between a resist dimension obtained in the lithography and a dimension obtained after the dryetch is calculated. Furthermore, after calculating a difference between the first dimension difference and the second dimension difference, the first gate portion or the second gate portion is corrected in the design data by using the calculated difference. Thereafter, the optical simulation is executed on the design data having been corrected by using the difference, so as to generate mask data.

7 Claims, 2 Drawing Sheets

MASK DATA GENERATION METHOD

CROSS-REFERENCE TO RELATED APPLICATIONS

This application claims priority under 35 U.S.C. §119 on Patent Application No. 2005-75776 filed in Japan on Mar. 16, 2005, the entire contents of which are hereby incorporated by reference.

BACKGROUND OF THE INVENTION

The present invention relates to a mask data generation method for use in lithography performed in semiconductor fabrication process, and more particularly, it relates to a mask data generation method in which dimension correction is performed in generating, through optical simulation, mask data for a semiconductor integrated circuit device having a dual gate structure.

As is well known, for attaining desired performance of a semiconductor integrated circuit by reducing variation in transistor characteristics, it is very significant to highly precisely form a gate pattern of a transistor recently further refined.

Since the threshold voltage of each transistor is recently highly precisely controlled by reducing a driving voltage in a CMOS (complementary metal oxide semiconductor) device including an NMOS transistor and a PMOS transistor, what is called a dual gate structure is now mainly employed.

In the dual gate structure, a gate electrode made of polysilicon doped with an N-type impurity is used as a gate portion of the NMOS transistor and a gate electrode made of polysilicon doped with a P-type impurity is used as a gate portion of the PMOS transistor. In this case, the gate electrodes are formed by simultaneously forming an N-type gate and a P-type gate in one dryetch process using an etching mask patterned based on one mask data. At this point, even when masks with the same width are used, the finished dimension of the polysilicon electrode is frequently different between the N-type gate and the P-type gate. In the case where the finished dimensions are thus different depending upon the doped impurities in the dual gate structure, it is necessary to correct the dimension difference for securing desired transistor performance. Japanese Laid-Open Patent Publication No. 11-174658 (Literature 1) discloses a method for correcting this dimension difference.

On the other hand, a mask data generation method using optical simulation has been put to practical use as described in Japanese Laid-Open Patent Publication No. 01-019470 (Literature 2). This is because a dimension difference derived from a pattern shape difference owing to an optical proximity effect has become too large to ignore in accordance with recent refinement of a CMOS device.

It is, however, difficult to attain both pattern correction for correcting a dimension difference caused in dryetch between an N-type gate and a P-type gate different in the doped impurity and pattern correction for correcting a dimension difference caused by optical proximity effect upon a pattern layout.

This is for the following reason: The optical simulation performed for correcting a dimension difference is a method for correcting the optical proximity effect, and pattern dependency of the process dimension difference caused in the dryetch process between an N-type gate and a P-type gate cannot be incorporated into the correction for the optical proximity effect.

Furthermore, a correction quantity determined in Literature 1 is based on comparison between a designed dimension and a dimension obtained after dryetch (post-dryetch dimension), and therefore, a dimension difference derived from distance dependency of adjacent patterns is already included in a dimension difference caused by the optical proximity effect of lithography. Accordingly, the correction method disclosed in Literature 1 cannot be directly combined with mask data correction process using a pattern shape obtained by the general optical simulation.

In other words, although it is necessary to perform the optical simulation in accordance with the refinement of a device, the pattern correction for the difference in the conductivity type of impurities cannot be currently incorporated into the optical simulation performed for correcting the resist dimension difference caused in the exposure depending upon a pattern shape.

An object of the invention is overcoming the aforementioned conventional disadvantage, so that dimension correction for gate structures with different conductivity types can be incorporated into the optical simulation in generating mask data for a semiconductor integrated circuit device including the gate structures different in the conductivity types, namely, the so-called dual gate structure.

SUMMARY OF THE INVENTION

In order to achieve the object, in the mask data generation method of this invention, a correction value introduced from a dimension difference between a resist dimension and a post-dryetch dimension caused in each of an N-type gate portion and a P-type gate portion of the dual gate structure is calculated and the optical simulation is executed on layout data obtained in consideration of the calculated correction value.

Specifically, the first mask data generation method of this invention in which optical simulation is performed on a dual gate including a first gate portion doped with an impurity of a first conductivity type and a second gate portion doped with an impurity of a second conductivity type for correcting design data including the dual gate, includes the steps of (a) calculating a first dimension difference of the first gate portion between a resist dimension obtained in lithography and a dimension obtained after dryetch following the lithography; (b) calculating a second dimension difference of the second gate portion between a resist dimension obtained in the lithography and a dimension obtained after the dryetch; (c) calculating a difference between the first dimension difference and the second dimension difference; (d) correcting the first gate portion or the second gate portion in the design data by using the difference calculated in the step (c); and (e) generating mask data by executing the optical simulation on the design data having been corrected by using the difference.

In the first mask data generation method, the correction of a dimension difference caused between the first gate portion and the second gate portion and the correction of a resist dimension difference caused depending upon a pattern layout can be both performed. Therefore, the gate dimensions of refined transistors can be highly precisely processed, so as to reduce variation in the transistor characteristics. As a result, a resultant semiconductor integrated circuit device having the dual gate structure can attain desired performance.

The first mask data generation method of preferably further includes, before the step (d), a step (f) of extracting the first gate portion or the second gate portion from the design data, and the first gate portion or the second gate portion extracted from the design data in the step (f) is preferably corrected in the step (d).

The second mask data generation method of this invention in which optical simulation is performed on a dual gate including a first gate portion doped with an impurity of a first conductivity type and a second gate portion doped with an impurity of a second conductivity type for correcting design data including the dual gate, includes the steps of (a) generating initial mask data by executing the optical simulation on the design data; (b) calculating a first dimension difference of the first gate portion between a resist dimension obtained in lithography and a dimension obtained after dryetch following the lithography; (c) calculating a second dimension difference of the second gate portion between a resist dimension obtained in the lithography and a dimension obtained after the dryetch; (d) calculating a difference between the first dimension difference and the second dimension difference; and (e) correcting the first gate portion or the second gate portion in the initial mask data by using the difference calculated in the step (d).

In the second mask data generation method, the same effect as that attained by the first mask data generation method of the invention can be attained. In addition, the initial mask data is generated by executing the optical simulation on the design data, and thereafter, the dimension difference caused between the first gate portion and the second gate portion is corrected in the same manner as in the first mask data generation method. Accordingly, since the optical simulation is executed on the design data not having been subjected to the pattern correction, a correction error derived from optical proximity effect correction can be avoided in executing the optical simulation.

The second mask data generation method preferably further includes, before the steps (b) and (c), a step (g) of obtaining dependency on a mask correction quantity of a dimension difference obtained after the dryetch, and the dependency on the mask correction quantity is preferably introduced into the difference in the step (d).

The second mask data generation method preferably further includes, before the step (e), a step (h) of extracting the first gate portion or the second gate portion from the design data, and the first gate portion or the second gate portion extracted from the design data in the step (h) is preferably corrected in the step (e).

In the first or second mask data generation method, it is preferred that the dual gate is made of polysilicon, that the impurity of the first conductivity type is arsenic or phosphorus and that the impurity of the second conductivity type is boron.

As described so far, according to the mask data generation method of this invention, gate dimensions of transistors having a refined dual gate structure can be highly precisely processed, and therefore, the variation in the transistor characteristics can be reduced. As a result, the resultant semiconductor integrated circuit device can attain desired performance.

DETAILED DESCRIPTION OF THE INVENTION

Embodiment 1

Embodiment 1 of the invention will now be described with reference to the accompanying drawing.

Figure 1:
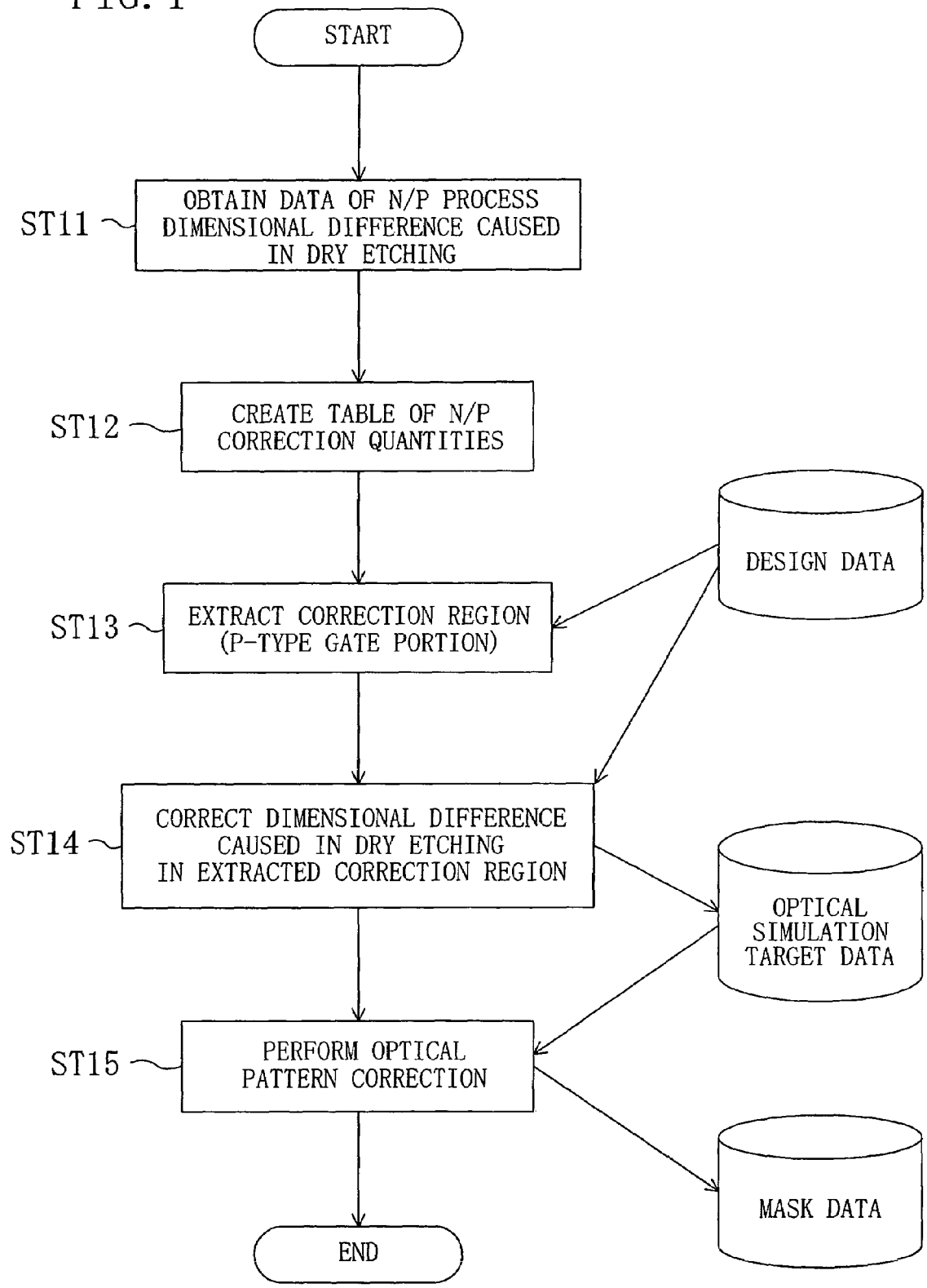
FIG. 1 is a flow chart for showing procedures in mask data generation for a dual gate type MIS semiconductor device according to Embodiment 1 of the invention.

FIG. 1 is a flow chart for a mask data generation method for a dual gate type MIS semiconductor device according to this embodiment.

It is assumed in Embodiment 1 that mask data of a MIS transistor having a dual gate structure including an N-type gate portion and a P-type gate portion in one gate pattern is to be generated.

As shown in FIG. 1, first, in step ST11, data of a dimension difference between a resist dimension (post-exposure dimension) and a post-dryetch dimension is obtained as data of a dimension difference after gate dryetch caused between the N-type gate portion and the P-type gate portion.

Next, in step ST12, a table of correction quantities ΔLp for the P-type gate portion is created. Table 1 below corresponds to the correction quantity table of Embodiment 1. As shown in Table 1, in the case where a gate dimension (gate length) is, for example, not less than 65 nm and less than 100 nm, the post-dryetch dimension of the P-type gate portion is equal to the post-dryetch dimension of the N-type gate portion, and hence, there is no need to perform correction. Also, in the case where the gate dimension is not less than 100 nm and less than 150 nm, it is necessary to make the P-type gate portion smaller than the N-type gate portion by a target correction quantity of 0.5 nm.

TABLE 1

Correction Quantity Table

| Gate Dimension L (nm) | Target Correction Quantity ΔLp (nm) |
|---|---|
| 65 ≦ L < 100 | 0 |
| 100 ≦ L < 150 | −0.5 |
| 150 ≦ L < 300 | −1 |
| L ≧ 300 | −2 |

Although the gate dimension of the P-type gate portion alone is corrected in this embodiment, a gate distance may be corrected if necessary. Also, instead of the correction of the P-type gate portion by using the N-type gate portion as a reference, the N-type gate portion may be corrected by using the P-type gate portion as a reference.

Next, in step ST13, the P-type gate portion where the correction should be performed is extracted from design data of the semiconductor device.

Then, in step ST14, the correction is executed on the extracted P-type gate portion in accordance with the target correction quantity stored in the correction quantity table of Table 1, thereby generating optical simulation target data.

Next, in step ST15, desired mask data is generated from the generated optical simulation target data by using a known light intensity simulator.

In this manner, according to Embodiment 1, a first dimension difference of the N-type gate portion between a resist dimension obtained in lithography and a dimension obtained in dryetch following the lithography is calculated, and a second dimension difference of the P-type gate portion between a resist dimension obtained in the lithography and a dimension obtained after the dryetch is calculated. Thereafter, a target correction quantity ΔLp corresponding to a difference between the first dimension difference and the second dimension difference is calculated. Furthermore, the P-type gate portion included in the design data is corrected by using the calculated target correction quantity ΔLp. Therefore, the optical simulation can be executed with the correction of the dimension difference caused between the N-type gate portion and the P-type gate portion incorporated into the correction of resist dimension difference caused depending upon a pattern layout. Accordingly, since the gate dimensions of transistors having a refined dual gate structure can be highly precisely processed, variation in transistor characteristics can be reduced. As a result, it is possible to attain desired performance of the transistors having the dual gate structure.

Embodiment 2

Embodiment 2 of the invention will now be described with reference to the accompanying drawing.

In Embodiment 1 described above, the optical simulation target data into which the pattern correction of the P-type gate portion (N/P correction) is introduced is used as the target data for the optical simulation. Therefore, the data quantity of the target data itself of the simulation is so large that the load of the optical simulation process tends to be large. Furthermore, there may be a case where the optical simulation process cannot be influenced by a small dimension difference as shown in Table 1.

Figure 2:
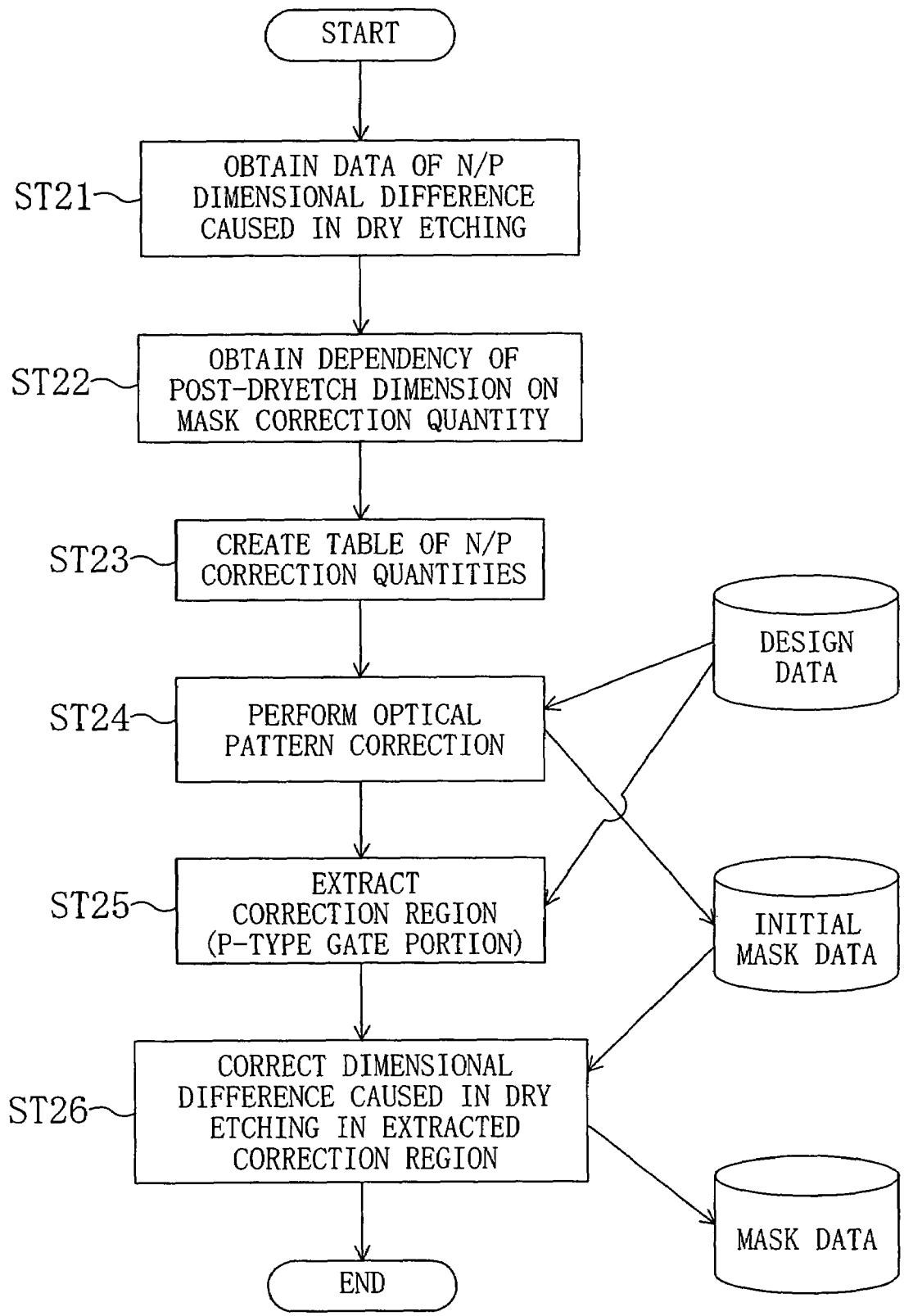
FIG. 2 is a flow chart for showing procedures in mask data generation for a dual gate type MIS semiconductor device according to Embodiment 2 of the invention.

Therefore, in Embodiment 2, the optical simulation is first executed on design data as shown in a flow chart of FIG. 2, and thereafter, provisional mask data (initial mask data) resulting from the optical simulation is subjected to the pattern correction (the N/P correction).

Specifically, as shown in FIG. 2, in step ST21, data of a dimension difference between a resist dimension (post-exposure dimension) and a post-dryetch dimension is first obtained as data of a post-dryetch dimension difference caused between an N-type gate portion and a P-type gate portion. Subsequently, a table of correction quantities ΔLp for the P-type gate portion is created. Table 2 below corresponds to the correction quantity table. In this case, Table 2 is the same as Table 1 of Embodiment 1.

TABLE 2

Correction Quantity Table

| Gate Dimension<br>L (nm) | Target Correction Quantity<br>ΔLp (nm) |
|---|---|
| 65 ≦ L < 100 | 0 |
| 100 ≦ L < 150 | −0.5 |
| 150 ≦ L < 300 | −1 |
| L ≧ 300 | −2 |

Next, in step ST22, data of dependency on the mask correction quantity of the post-dryetch dimension through exposure is obtained. Table 3 shows the dependency data used in Embodiment 2. Since the pattern correction (N/P correction) is executed on the initial mask data obtained through the optical simulation in Embodiment 2, the dependency data between the mask correction quantity and the post-dryetch dimension through the exposure is necessary.

TABLE 3

Relationship between Mask Correction Quantity and Finished Dimensional Difference

| Mask Correction Quantity<br>ΔL mask (nm) | Post-dryetch<br>Dimensional Difference<br>ΔL wafer (nm) |
|---|---|
| 0.5 | 0.8 |
| 1.0 | 1.5 |
| 1.5 | 2.3 |
| 2.0 | 3.0 |

It is understood from Table 3 that a dimension difference substantially 1.5 times as large as the mask correction quantity is caused in the dryetch.

Then, in step ST23, a mask correction quantity table corresponding to the correction quantities ΔLp of the P-type gate portion is created as shown in Table 4 below on the basis of the data listed in Tables 2 and 3.

TABLE 4

Mask Correction Quantity Table

| Gate Dimension<br>L (nm) | Mask Correction Quantity<br>ΔLp (nm) |
|---|---|
| 65 ≦ L < 100 | 0 |
| 100 ≦ L < 150 | 0.3 |
| 150 ≦ L < 300 | 0.7 |
| L ≧ 300 | 1.3 |

Next, in step ST24, the optical simulation is executed on design data of the semiconductor device by using a known light intensity simulator so as to generate initial mask data. Since the optical simulation is executed on the design data in Embodiment 2 differently from Embodiment 1, dimensions of data to be simulated are not varied through the correction but uniform. Accordingly, a correction error caused through the execution of the simulation such as rounding is minimally caused and the quantity of the data itself does not increase, and therefore, the simulation can be executed in a comparatively short period of time.

Then, in step ST25, the P-type gate portion where the correction should be performed is extracted from the design data.

Next, in step ST26, the extracted P-type gate portion is subjected to the correction in accordance with the correction quantity stored in the mask correction quantity table of Table 4, thereby generating desired mask data from the initial mask data.

In this manner, according to Embodiment 2, not only the same effect as that of Embodiment 1 can be attained but also a dimension difference between the N-type gate portion and the P-type gate portion of the dual gate structure can be definitely corrected on a wafer because the pattern correction of the P-type gate portion is performed on the initial mask data generated through the optical simulation executed on the design data.

Although the gate dimension of the P-type gate portion alone is corrected also in this embodiment, a gate distance may be corrected if necessary. Also, instead of the correction of the P-type gate portion by using the N-type gate portion as a reference, the N-type gate portion may be corrected by using the P-type gate portion as a reference.

As described so far, according to the mask data generation method of this invention, the gate dimensions of transistors of the dual gate structure can be precisely processed, and hence, fluctuation in the transistor characteristics can be reduced so as to attain desired performance of a semiconductor integrated circuit device. Accordingly, the invention is useful as, for example, a mask data generation method in which dimension correction is performed in generating, through the optical simulation, mask data of a semiconductor integrated circuit device having a dual gate structure.

What is claimed is:

1. A mask data generation method in which optical simulation is performed on a dual gate including a first gate portion doped with an impurity of a first conductivity type and a second gate portion doped with an impurity of a second conductivity type for correcting design data including said dual gate, comprising the steps of:
   (a) calculating a first dimension difference of said first gate portion between a resist dimension obtained in lithography and a dimension obtained after dryetch following the lithography;
   (b) calculating a second dimension difference of said second gate portion between a resist dimension obtained in the lithography and a dimension obtained after the dryetch;
   (c) calculating a difference between said first dimension difference and said second dimension difference;
   (d) correcting said first gate portion or said second gate portion in said design data by using said difference calculated in the step (c); and
   (e) generating mask data by executing the optical simulation on said design data having been corrected by using said difference.

2. The mask data generation method of claim 1, further comprising, before the step (d), a step (f) of extracting said first gate portion or said second gate portion from said design data,
   wherein said first gate portion or said second gate portion extracted from said design data in the step (f) is corrected in the step (d).

3. The mask data generation method of claim 1,
   wherein said dual gate is made of polysilicon, and
   said impurity of the first conductivity type is arsenic or phosphorus and said impurity of the second conductivity type is boron.

4. A mask data generation method in which optical simulation is performed on a dual gate including a first gate portion doped with an impurity of a first conductivity type and a second gate portion doped with an impurity of a second conductivity type for correcting design data including said dual gate, comprising the steps of:
   (a) generating initial mask data by executing the optical simulation on said design data;
   (b) calculating a first dimension difference of said first gate portion between a resist dimension obtained in lithography and a dimension obtained after dryetch following the lithography;
   (c) calculating a second dimension difference of said second gate portion between a resist dimension obtained in the lithography and a dimension obtained after the dryetch;
   (d) calculating a difference between said first dimension difference and said second dimension difference; and
   (e) correcting said first gate portion or said second gate portion in said initial mask data by using said difference calculated in the step (d).

5. The mask data generation method of claim 4, further comprising, before the steps (b) and (c), a step (g) of obtaining dependency on a mask correction quantity of a dimension difference obtained after the dryetch,
   wherein said dependency on the mask correction quantity is introduced into said difference in the step (d).

6. The mask data generation method of claim 4, further comprising, before the step (e), a step (h) of extracting said first gate portion or said second gate portion from said design data,
   wherein said first gate portion or said second gate portion extracted from said design data in the step (h) is corrected in the step (e).

7. The mask data generation method of claim 4,
   wherein said dual gate is made of polysilicon, and
   said impurity of the first conductivity type is arsenic or phosphorus and said impurity of the second conductivity type is boron.

* * * * *